(12) United States Patent
Krueger

(10) Patent No.: US 7,026,628 B2
(45) Date of Patent: *Apr. 11, 2006

(54) ADVANCED ION BEAM DETECTOR FOR ION IMPLANTATION TOOLS

(75) Inventor: Christian Krueger, Liegau-Augustusbad (DE)

(73) Assignee: Advanced Micro Devices, Inc., Austin, TX (US)

( * ) Notice: Subject to any disclaimer, the term of this patent is extended or adjusted under 35 U.S.C. 154(b) by 51 days.

This patent is subject to a terminal disclaimer.

(21) Appl. No.: 10/786,456

(22) Filed: Feb. 25, 2004

(65) Prior Publication Data

US 2004/0262533 A1    Dec. 30, 2004

(30) Foreign Application Priority Data

Jun. 30, 2003    (DE) ................................ 103 29 383

(51) Int. Cl.
*H01J 37/244*    (2006.01)

(52) U.S. Cl. .................... 250/397; 250/492.21
(58) Field of Classification Search ................. 250/397
See application file for complete search history.

(56) References Cited

U.S. PATENT DOCUMENTS

| | | | | |
|---|---|---|---|---|
| 4,816,693 | A | * | 3/1989 | Rathmell ................. 250/492.2 |
| 5,068,539 | A | | 11/1991 | Nogami et al. .......... 250/492.2 |
| 5,903,002 | A | * | 5/1999 | Turner et al. ................ 250/281 |
| 6,614,027 | B1 | * | 9/2003 | Iwasawa ..................... 250/398 |

FOREIGN PATENT DOCUMENTS

| | | |
|---|---|---|
| JP | 02051836 A | 2/1990 |
| JP | 2000065942 A | 3/2000 |
| WO | WO 01/51183 A1 | 7/2001 |

OTHER PUBLICATIONS

US 6,316,775, 11/2001, Nasser-Ghodsi (withdrawn)

* cited by examiner

*Primary Examiner*—Nikita Wells
*Assistant Examiner*—Phillip A. Johnston
(74) *Attorney, Agent, or Firm*—Williams, Morgan & Amerson, P.C.

(57) ABSTRACT

The present invention provides an improved Faraday cup configuration that allows determination of a non-zero angle of incidence and/or a beam divergence with high accuracy. Moreover, by substantially simultaneously and continuously displaying information of a plurality of Faraday cups, the set-up of an implantation tool may be significantly facilitated and may be carried out in a substantially automated manner.

32 Claims, 5 Drawing Sheets

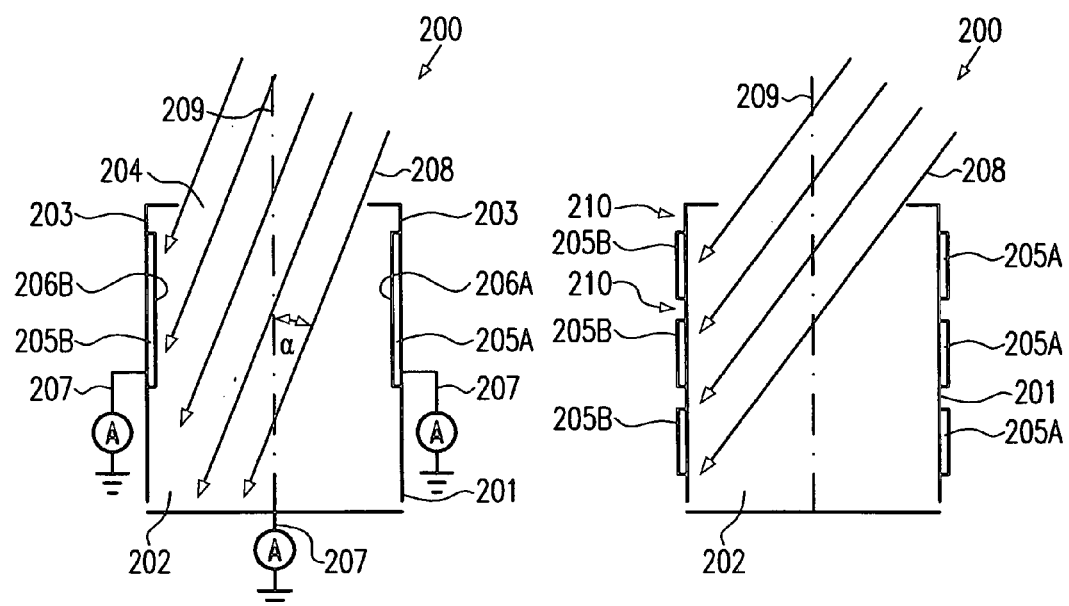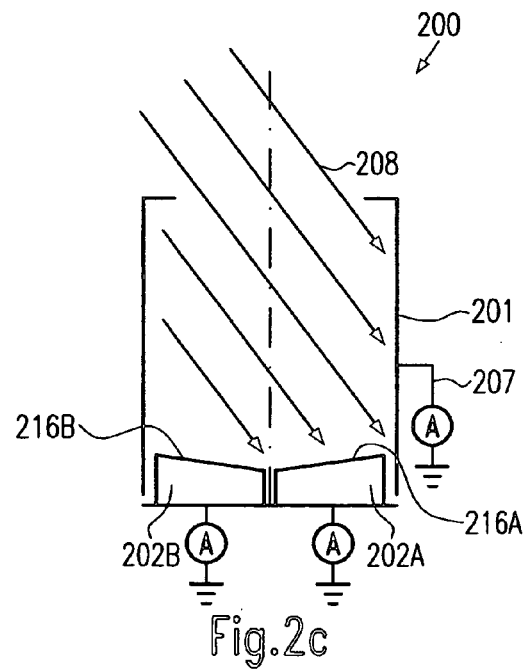

ADVANCED ION BEAM DETECTOR FOR ION IMPLANTATION TOOLS

BACKGROUND OF THE INVENTION

1. Field of the Invention

The present invention generally relates to the fabrication of microstructures, such as integrated circuits, and, more particularly, to the operation of ion implantation tools required for producing well-defined doped regions in specified material regions, such as semiconductive regions.

2. Description of the Related Art

The fabrication of complex microstructures, such as sophisticated integrated circuits, requires that a large number of individual process steps be performed to finally obtain the required functionality of the microstructure. Especially in the formation of integrated circuits, the conductivity of specific areas has to be adapted to design requirements. For instance, the conductivity of a semiconductor region may be increased in a well-defined manner by introducing specific impurities, which are also referred to as dopants, and placing some, or preferably all, of these impurities at lattice sites of the semiconductor crystal. In this way, so-called PN junctions may be formed that are essential for obtaining a transistor function, since transistors represent the active elements, i.e., elements providing current or voltage amplification, which are required for manufacturing electronic circuits.

In modern integrated circuits, typically, millions of transistor elements, such as field effect transistors, are provided on a single die, wherein, in turn, a plurality of dies are provided on a single substrate. As the critical dimensions of certain circuit elements, such as field effect transistors, have now reached 0.1 µm and even less, it is of great importance to correspondingly "fine-tune" the profile of doped regions in the lateral direction, with respect to a substrate, as well as in the depth direction. Commonly, ion implantation is the preferred method for introducing dopants into specified device regions due to the ability to precisely control the number of implanted dopant atoms into substrates with a repeatability and uniformity of better than ±1%. Moreover, impurities that are introduced by ion implantation have a significantly lower lateral distribution when compared to conventional dopant diffusion dopant processes. Since ion implantation is typically a room temperature process, the lateral profiling of a doped region may in many cases conveniently be achieved by providing a correspondingly patterned photoresist mask layer. These characteristics may render ion implantation currently, and in the near future, the preferred technique to produce doped regions in a semiconductor device.

Implantation of dopants is accomplished by various ion implantation tools. Such tools are extremely complex machines that require continuous monitoring of the machine characteristics so as to achieve high efficiency and machine utilization.

With reference to FIG. 1, a schematic overview is given for a typical ion implantation tool and the operation thereof. In FIG. 1, an ion implantation tool 100 comprises an ion source 101 having an input 102 that is connected to respective precursor sources (not shown) from which an appropriate ion species may be created in the ion source 101. The ion source 101 may be configured to establish a plasma atmosphere and to pre-accelerate charged particles into a beam pipe schematically depicted as 103. Downstream of the ion source 101, an accelerator tube 104 is arranged that is dimensioned to accelerate ions with a specified voltage, which may typically range from zero to approximately 200 keV for a typical medium current implanter, and may range to several hundred keVs or even to 1 MeV or more in high energy implanters. Next, a beam shaping element 105, such as a quadrupole magnet, may be arranged followed by a deflector magnet 106. Downstream of the deflector magnet 106 is disposed an analyzing aperture, for instance in the form of a slit 107, the dimensions of which substantially determine an energy spread of the ion beam. Thereafter, a further beam shaping element, such as a quadrupole magnet 108, may be provided downstream of the analyzing slit 107.

A substrate holder 109 is located at the vicinity of the end of the beam line 103, wherein typically the substrate holder 109 may be provided in the form of a plate enabling the receipt of one or more substrates 110, wherein the plate 109 is connected to a drive assembly (not shown) that allows moving of the substrate holder 109 in the transverse direction (as indicated by the arrows depicted in FIG. 1) and also allows control of the tilt angle, at least in two planes, at which the ion beam hits the substrate 110. For convenience, corresponding means for controlling and adjusting the tilt angle are not shown. Moreover, a first ion beam detector 111 may be provided, for instance, embodied by a plurality of Faraday cups that are connected with respective current measurement devices. Furthermore, a second ion beam detector 112 may be provided as a so-called traveling Faraday cup that is laterally movable to determine the shape of an ion beam and/or to shade respective Faraday cups during the measurement of specific beam characteristics, such as the angle of incidence. A corresponding arrangement of ion beam detectors 111 and 112 is, for example, realized in an ion implanter VIIsta80®, available from Varian Inc. It should be noted, however, that a plurality of other ion beam detector arrangements are available in other presently available ion implantation tools. A Faraday cup is typically constructed as a conductive container, the interior of which maintains devoid of an electric field when the cup is hit by charged particles. This characteristic enables the detection of an ion beam substantially without influencing the ion beam when moving in the interior of the cup. Typically, a Faraday cup for implantation tools is made of graphite.

During the operation of the ion implantation tool 100, an appropriate precursor gas is supplied by the inlet 102 to the ion source 101 and ions of atoms included in the precursor gas may be accelerated into the beam line 103. Typically, a plurality of different ions having different charge states may be supplied by the ion source 101 and may thus be introduced into the acceleration tube 104. Typically, a preselection of the type of ions as well as of the respective charge states may be performed within the ion source 101 by a corresponding deflector magnet (not shown). Thereafter, the ions pass the accelerator tube 104 and gain speed in accordance with the applied acceleration voltage, the charge states of the respective ion and its corresponding mass. With the quadrupole magnet 105, the ion beam may be focused in one dimension and may be correspondingly defocused in the perpendicular dimension and the correspondingly shaped beam is directed to the deflector magnet 106. The current generating the magnetic field of the deflector magnet 106 is controlled so as to deflect the trajectory of desired ion species having a desired charge state to the opening of the analyzing slit 107. Ions of differing mass and/or charge state will typically hit the analyzer 107 without passing through the slit. Thus, the ions in the beam passing the analyzer 107 have a well-defined mass and an energy distribution defined by the slit size. It should be noted that, in some ion implantation tools, the deflecting magnet 106 and the analyzer 107 are configured such that the ion beam passing through the analyzer 107 may be scanned in a transverse direction so as to cover the whole area of a substrate or at least a significant portion thereof, since the dimension of the beam shape, i.e., the size of the beam spot, is usually, depending on the energy of the ion beam, significantly less than the area of a substrate to be processed.

Next, the beam passing through the analyzer 107 may be further shaped by the quadrupole magnet 108 so that, in combination with the quadruple magnet 105, a desired beam shape may be obtained. The characteristics of the ion beam, i.e., the beam shape, the angle of incidence onto the substrate holder 109 and the internal parallelism, i.e., the beam divergence, and the like, may be measured prior to actually exposing the substrate 110 to the ion beam. To this end, the substrate holder 109 may be removed from the ion beam and the first and/or the second beam detector 111 and 112 may be operated so as to obtain the required measurement results. For instance, the travelling Faraday cup 112 may be positioned at different transverse locations and the corresponding dosage received at each transverse position may be determined so as to estimate and adjust the beam uniformity. Moreover, the Faraday cup 112 may be positioned so as to subsequently shade corresponding Faraday cups of the first ion detector 111, the measurement readings of which may then be used to estimate the main beam incidence angle and the beam divergence. Since both an incorrect angle of incidence and an insufficiently parallel ion beam, i.e., a non-vanishing beam divergence, may compromise a corresponding lateral dopant profile on the substrate 110, it is extremely important to precisely monitor and control the tilt angle and the beam divergence.

It turns out, however, that any change of an implantation parameter, for example the change of any bias voltages of apertures, minor changes of the settings of the beam shaping elements 105 and 108, and the like, require a thorough check of the beam profile and/or of the parallelism and tilt angle, which may necessitate a scan with the travelling Faraday cup, rendering the re-adjustment procedure extremely time consuming so that production yield and tool utilization is reduced.

In view of the above-identified problems, there exists a need for an improved technique that allows improvement of efficiency and/or accuracy of ion beam monitoring in an implantation tool. The present invention is directed to various methods and systems that may solve, or at least reduce, some or all of the aforementioned problems.

SUMMARY OF THE INVENTION

Generally, the present invention is directed to various systems and methods that allow the observation of a beam shape during the process of adjusting beam parameters. Moreover, an improved Faraday cup design is provided that enables detection of an angle of incidence and/or a beam divergence with increased accuracy, wherein, contrary to a conventional Faraday cup, the inventive Faraday cup is divided into two or more sections that may independently be operated so as to detect portions of an ion beam impinging on the two or more separate portions.

According to one illustrative embodiment of the present invention, an ion beam detector comprises a Faraday cup body having a bottom portion, sidewalls and an entrance aperture that is arranged opposite to the bottom portion. Furthermore, a first conductive region is formed in the Faraday cup body and has a first detection surface which is oriented along a first direction. Additionally, a second conductive region is formed in the Faraday cup body that is electrically insulated from the first conductive region and has a second detection surface oriented along a second direction that is different from the first direction.

According to yet another illustrative embodiment of the present invention, a method of controlling characteristics of an ion beam comprises the following activities. First, subsequent sets of measurement readings are obtained from a plurality of the Faraday cups, wherein each Faraday cup is arranged relative to the ion beam so as to receive a portion of the ion beam. Each set of the measurement readings is gathered within a specified time interval. Then, at least one tool parameter related to the beam characteristic is adjusted on the basis of the subsequent sets of measurement readings.

In a further illustrative embodiment of the present invention, a Faraday cup comprises a bottom portion, sidewalls and an entrance aperture opposite to the bottom portion. A first conductive region has a first detection surface oriented along a first direction. A second conductive region that is electrically insulated from the first conductive region has a second detection surface oriented along a second direction that is different from the first direction.

BRIEF DESCRIPTION OF THE DRAWINGS

The invention may be understood by reference to the following description taken in conjunction with the accompanying drawings, in which like reference numerals identify like elements, and in which:

FIGS. 2a–2f schematically show improved Faraday cup designs in accordance with illustrative embodiments of the present invention;

Figure 1:
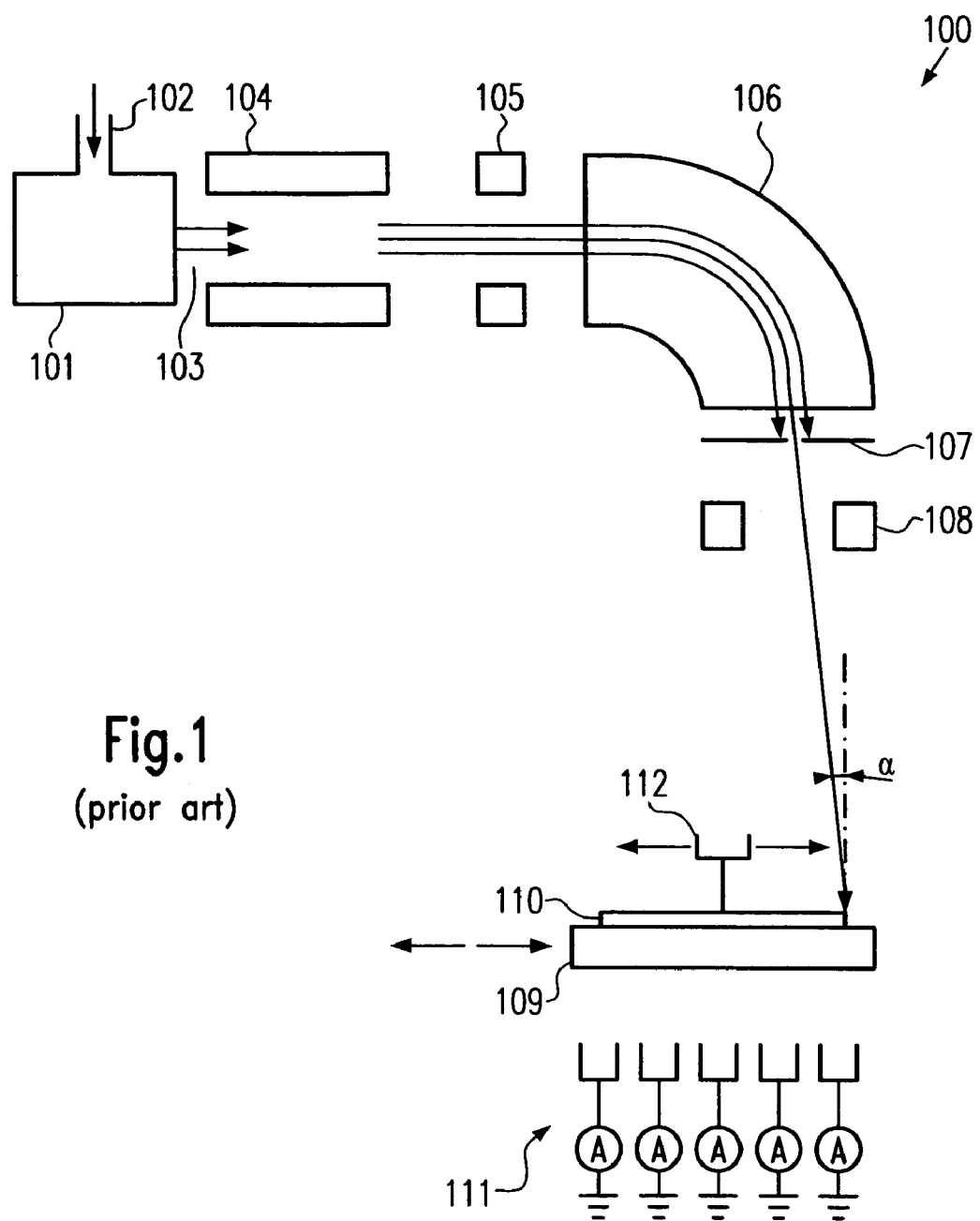
FIG. 1 schematically illustrates an ion implantation tool including an ion beam detection system as is presently employed in monitoring and adjusting an ion beam.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As previously explained, it is extremely important to monitor and adjust the angle of incidence with which an ion beam, or a small portion of an ion beam, impinges on a substrate. Insufficiently parallel beams or beam portions may be caused by an imprecise deflection of an ion beam as a whole and may also be caused by a significant amount of divergence within the ion beam. For instance, an ideal ion beam may have substantially no internal beam divergence, that is, all adjacent ions follow substantially parallel trajectories, whereas the direction of the ion beam may be slightly misaligned to the orientation of a target surface. Consequently, a dopant distribution within a region that is covered by a mask layer during the implantation process may show a higher number of dopant ions within the boundary between the uncovered and the covered region compared to a substantially perpendicular, i.e., parallel, incidence of the ion beam. On the other hand, it is very difficult to extremely reduce beam divergence, and a corresponding non-ideal ion beam having a certain amount of beam divergence, that is portions of the beam form an angle with respect to the mean direction of the ion beam, may also create an increased lateral ion distribution at the boundary between the covered and non-covered region, even if the main incidence direction is exactly aligned with the orientation of target surface. It is, therefore, desirable to provide an improved detection system that enables more accurate monitoring and detection of deviations of an ion beam or an ion beam portion from a desired direction with respect to the orientation of a target surface.

Figures 2D, 2E:
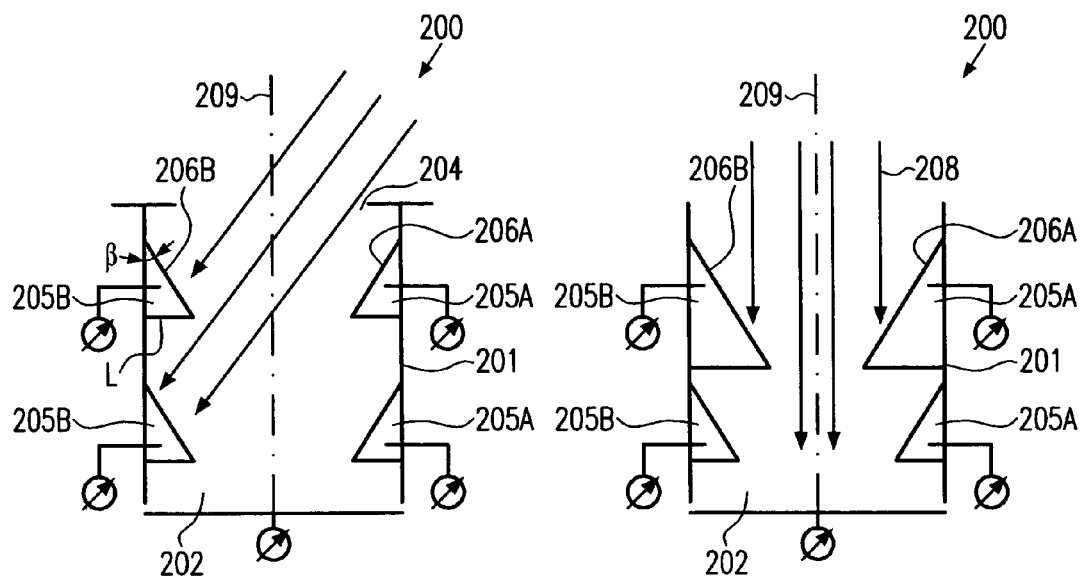

With respect to FIGS. 2a–2f, a plurality of improved detection designs will be described in more detail. FIG. 2a schematically illustrates an ion beam detector 200 in the form of a Faraday cup, which comprises a body 201 formed of an electrically conductive material. The body 201 comprises a bottom portion 202 and sidewall portions 203. The illustration of the detector 200 in FIG. 2a is a sectional view taken along a longitudinal axis 209 of the body 201 and it should be appreciated that the sidewalls 203 substantially completely enclose the interior of the body 201, except for an entrance aperture 204, which is disposed opposite to the bottom portion 202. A first conductive region 205A is formed on one of the sidewalls 203 and a second conductive region 205B may be formed substantially opposite to the first conductive region 205A. The conductive regions 205A and 205B are electrically insulated from each other and are also insulated with respect to the body 201. Moreover, respective detection surfaces 206A and 206B are formed on top of the conductive regions 205A and 205B. The first and second conductive regions 205A, 205B and the body 201 may comprise respective electrical connectors 207 that enable an electrical connection to respective measurement devices when the charges are drained off the conductive regions 205A, 205B and the body 201.

During use, the ion beam detector 200 is placed appropriately within an ion beam of an implantation tool, such as the tool 100, so that at least a portion of the ion beam enters into the entrance aperture 204. For instance, the travelling Faraday cup 112 of FIG. 1 may be replaced or may be complemented by the ion beam detector 200. As is illustrated in FIG. 2a in a somewhat exaggerated manner, an ion beam 208 enters the entrance aperture 204 with an angle of incidence a that is not zero with respect to the longitudinal axis 209 of the ion beam detector 200. In the illustration in FIG. 2a, it is assumed that a divergence of the ion beam 208 is substantially negligible, whereas the beam 208, as a whole, is misaligned with respect to the ion beam detector 200. Since the detector 200 may be properly aligned with respect to a substrate holder, such as the holder 109 in FIG. 1, with high accuracy, the ion beam 208 would lead to a deteriorated dopant profile when actually exposing a substrate to the beam 208. As is shown, owing to the angle α, the detection surface 206B is hit by a significantly higher amount of ions than the opposed detection surface 206A so that a corresponding measurement reading from the conductive region 205B will indicate a significantly higher beam current compared to the conductive region 205A. Moreover, the beam current absorbed by the body 201 may also be monitored. The integrated beam currents of the first and second conductive regions 205A, 205B and of the body 201 may present a measure of a total beam current and, thus, the dosage carried by the ion beam 208. Moreover, due to the different orientation of, for example, the detection surface 206B and the bottom portion 202, the magnitude of the angle of incidence a may be estimated by comparing the respective measurement readings. As may be seen from FIG. 2a, the effective surface area that is "seen" by the ion beam 208 substantially varies as the sine of the angle α and is substantially zero when the ion beam 208 is substantially parallel to the longitudinal axis 209 and increases as the angle α increases. Consequently, the current deposited by the ion beam 208 on the detection surface 206B varies correspondingly and may, therefore, represent a measurement value for the angle of incidence α. An analogous consideration also applies to the opposite detection surface 206A. The absolute magnitude of the beam current detected by, for example, the conductive region 205B, depends on the overall size of this region, and the dimensions of the conductive region 205B is advantageously selected so that a significant beam current is generated for angles of incidence in the range of approximately 0–5 degrees.

At the same time as the beam current increases in the conductive region 205B for an increasing angle of incidence α, the beam current detected by the bottom portion 202 decreases as the surface area exposed to the ion beam 208 also decreases. Since the sum of the beam currents detected by the conductive region 205B and the bottom portion 202 (and, of course, a minor amount of beam current at the conductive region 205A owing to minute amount of ions that may always be directed to the conductive region 205A due to scattering events and the like) is a measure for the total beam current, the angle of incidence α may be determined irrespective of any variation of the total beam current of the ion beam 208. Consequently, the ion beam detector 200 may be used to determine the angle of incidence α, as well as the total beam current when, for instance, the traveling Faraday cup 112 of FIG. 1 is replaced by the ion beam detector 200, the beam profile and the parallelism of the ion beam may be determined at the same time. It should be noted that, in principle, one conductive region 205B may be sufficient to estimate an angle deviation in one plane of the ion beam 208, when, for instance, it is assured, by a corresponding arrangement of the beam detector 200 with respect to the beam line, that an angle deviation may occur only in one direction. In this case, the conductive region 205a may be omitted and may be replaced by a conductive sidewall 203 of the body 201.

Moreover, the preceding embodiment is explained with reference to an angle deviation of the ion beam 208 within the plane of the drawing of FIG. 2a, whereas the same criteria apply for an angle deviation in a plane perpendicular to the drawing plane of FIG. 2a. In this case, one or two respective conductive regions may be provided at respective sidewall portions of the body 201 and the incident beam current may be monitored as described above. Furthermore, as previously explained, the ion beam 208 may also comprise a certain amount of beam divergence, i.e., the ion beam 208 may consist of a plurality of trajectories that are centered around a mean angle of incidence. The corresponding distribution of angles of incidence that are simultaneously present within the body 201 is determined by the lateral dimensions of the entrance aperture 204 and the longitudinal dimension of the body 201, i.e., the aspect ratio, and, thus, the dimensions of the ion beam detector 200 may be selected so as to, for example, minimize the beam divergence within the body 201 when, primarily, the main orientation of the ion beam 208 with respect to a substrate is deemed relevant.

In other embodiments, the angle distribution within the body 201 may be estimated by the beam currents provided by the first and second conductive regions 205B, 205A and the bottom portion 202. For instance, a relatively high beam divergence may increase the amount of beam current detected by the conductive region 205A, even if the mean angle of incidence α is moderately large. Thus, any angle deviation of the ion beam 208 may be estimated by the arrangement as depicted in FIG. 2a.

Although not shown in FIG. 2a, the ion beam detector 200 may comprise suitable means for substantially suppressing the release of secondary charged particles from the interior of the body 201. When high energetic ions of the ion beam 208 hit the body 201 or the conductive regions 205A, 205B, electrons may be released and may exit the body 201, thereby falsifying the total beam current detected by the ion beam detector 200, since each electron leaving the body 201 compensates an oncoming ion of charge state 1. Consequently, respective bias voltages may be applied to the upper portion of the body 201 so as to force liberated electrons back to the body 201. Additionally, or alternatively, a magnet assembly may be provided around the body 201 that correspondingly affects the electron trajectories while substantially not influencing the high energetic ions. Moreover, the aspect ratio of the body 201 may be selected moderately high so that most of the secondary electrons are produced at a lower portion of the body 201, thereby reducing the amount of electrons that may escape through the entrance aperture 204. A typical aspect ratio may range from approximately 2–5.

FIG. 2b schematically shows a further illustrative embodiment of the ion beam detector 200, which now comprises a plurality of electrically conductive regions 205B and a plurality of conductive regions 205A arranged in a substantially opposing relationship. Each of the conductive regions 205B and 205A is electrically insulated from other conductive regions and is also electrically insulated from the body 201. The beam currents detected by each of the conductive regions 205B and 205A may individually be monitored and may be used to evaluate the angle of incidence of the ion beam 208. The provision of a plurality of conductive regions 205B formed on one sidewall 203 may offer a higher degree of spatial resolution in detecting the ion beam 208 when entering the body 201 with a non-zero angle of incidence. Moreover, for low aspect ratio detectors 200, the enhanced spatial resolution in detecting the ion beam 208 may allow a more accurate determination of an angle distribution, i.e., a beam divergence, of the incident ion beam 208. Thus, a highly accurate angle measurement may be performed with the ion beam detector 200, even for low energy beams of relatively large diameter, as is typical for low energy beams. Moreover, as already explained with reference to FIG. 2a, a corresponding bias voltage may be supplied at, for example, regions 210 to suppress the escape of secondary electrons and the subsequent recapture of these electrons at adjacent conductive regions. Typically, a bias voltage of approximately 50–200 volts may be sufficient so as to prevent secondary electrons from escaping the body 201 or reaching adjacent conductive regions. The dimensions and number of the conductive regions 205B and 205A as well as the spacing and corresponding bias voltages may be obtained by experiment, in that different geometries are exposed to an ion beam and the corresponding measurement readings are compared with each other. The arrangement resulting in optimum measurement readings for a specified ion energy range may then be selected.

FIG. 2c schematically shows a further variant of the ion beam detector 200. In this embodiment, the bottom portion of the body 201 may be divided into two parts 202A, 202B that are electrically insulated from each other and from the remaining body 201. The bottom portions 202A, 202B comprise respective detection surfaces 216A, 216B, which are shown as being oriented with an angle with respect to a lateral dimension of the body 201. The inclination of the detection surface 216A, 216B, which may be on the order of a typical maximum angle deviation of the ion beam 208, may enhance the sensitivity in detecting any angle deviations. In other embodiments, the detection surfaces 216A, 216B may be substantially coplanar with the lateral dimension of the body 201. Similarly, as with the embodiments described above, the ion beam detector of FIG. 2c is sensitive to the total beam current by adding up all current components provided by the body 201 and the bottom portions 202A and 202B. Moreover, an angle-dependent component is obtained from the bottom portion 202A and 202B as well as from the sidewalls of the body 201. A space between the bottom portions 202B and 202A and a space between the sidewalls of the body 201 and the bottom portions 202A and 202B may be selected so as to minimize absorption of secondary particles liberated from an adjacent region. Additionally, an appropriate bias voltage may be applied between the individual components so as to re-accelerate electrons to the detection surfaces from which these electrons were sputtered off. For instance, a distance of approximately 1–5 mm with a bias voltage of approximately 30–150 V may substantially avoid measurement falsification for ion beam energies up to approximately 200 keV.

FIG. 2d schematically shows a further illustrative embodiment of the ion beam detector 200, wherein a plurality of conductive regions 205A and a plurality of conductive regions 205B are arranged in a substantially opposing relationship, wherein respective detection surfaces 206A and 206B are inclined with respect to the longitudinal axis of the body 201. The inclination of the respective detection surfaces 206A, 206B increases the effective surface for a non-zero angle of incidence of the ion beam 208. The inclination angle with respect to the longitudinal axis 209, which is herein indicated as β, and the lateral length of the conductive regions 205A and 205B, herein indicated as L, may be varied so as to obtain a required response for an ion beam 208 having an energy within a specified range and having an angle deviation within a specified range. Moreover, the lateral dimension of the entrance aperture 204 may be selected appropriately, depending on whether or not a significant measurement reading is desired for a substantially parallel incidence of the ion beam 208. Hence, if the perimeter of the entrance aperture 204 covers the lateral length L of the conductive regions 205A, 205B, substantially no ions are expected to hit the detection surfaces 206A, 206B of the conductive regions 205A, 205B formed on the upper portion of the body 201. Regarding any arrangements for suppressing the escape of secondary particles from the interior of the body 201 and the recapture of secondary particles by the conductive regions 205A, 205B, the same criteria apply as previously pointed out with the embodiment described above. In some embodiments, the angle β and/or the length L may be selected differently for each of the conductive regions 205A, 205B. This may be advantageous, for example, when a systematic drift in the angle of incidence typically exists in the implantation tool.

FIG. 2e schematically shows a further illustrative embodiment of the ion detector 200 that is similar to the embodiment shown in FIG. 2d, wherein the conductive regions 205A formed on one side of the body 201 have a different size. Accordingly, the conductive regions 205B also have a different size. In some embodiments, the angle β may be selected differently for each of the conductive regions 205A and each of the conductive regions 205B. Moreover, oppositely disposed conductive regions 205A and 205B may also differ in size and the angle β. In FIG. 2e, the ion beam 208 impinges substantially parallel to the longitudinal axis 209 and, therefore, the upper conductive regions 205A, 205B, having an increased size, will produce a significant measurement reading, whereas the conductive portions 205A, 205B, formed at the lower portion of the body 201, are substantially completely shaded and will provide substantially no current readings, except for a few scattered ions and secondary particles.

Figure 2F:
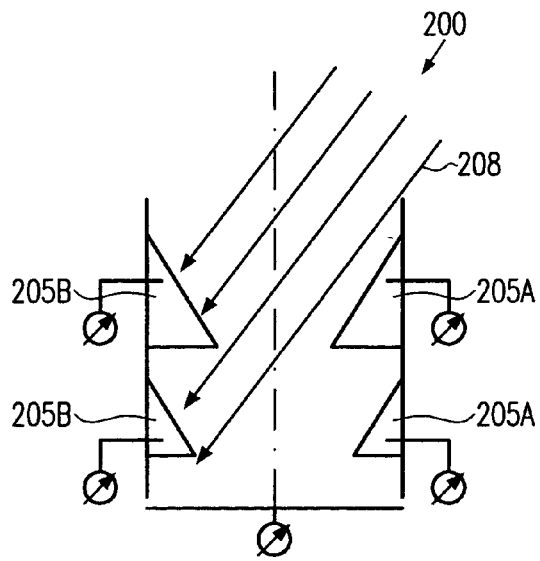

FIG. 2f shows the same embodiment, when the ion beam 208 is hitting the ion detector 200 with a non-zero angle of incidence. In this case, both conductive regions 205B receive a significant beam current, whereas the current to the bottom portion 202 and the conductive regions 205A is significantly reduced. The arrangement of FIGS. 2e and 2f may provide an enhanced measurement efficiency for angles of incidence exceeding a certain threshold. For instance, the bottom conductive regions 205A, 205B may be dimensioned so as to receive a portion of the beam 208 only when a certain angle of incidence is reached. This may allow implementation of an intrinsic "comparator" characteristic in the ion beam detector 200, as the ion beam current reading in the lower conductive regions 205A, 205B is negligible as long as the threshold incidence angle is not reached.

As pointed out with reference to FIG. 2a, the arrangements shown above may as well be applied to a measurement in the plane perpendicular to the drawing plane so that a beam angle deviation in two substantially perpendicular directions may be detected.

Figure 3:
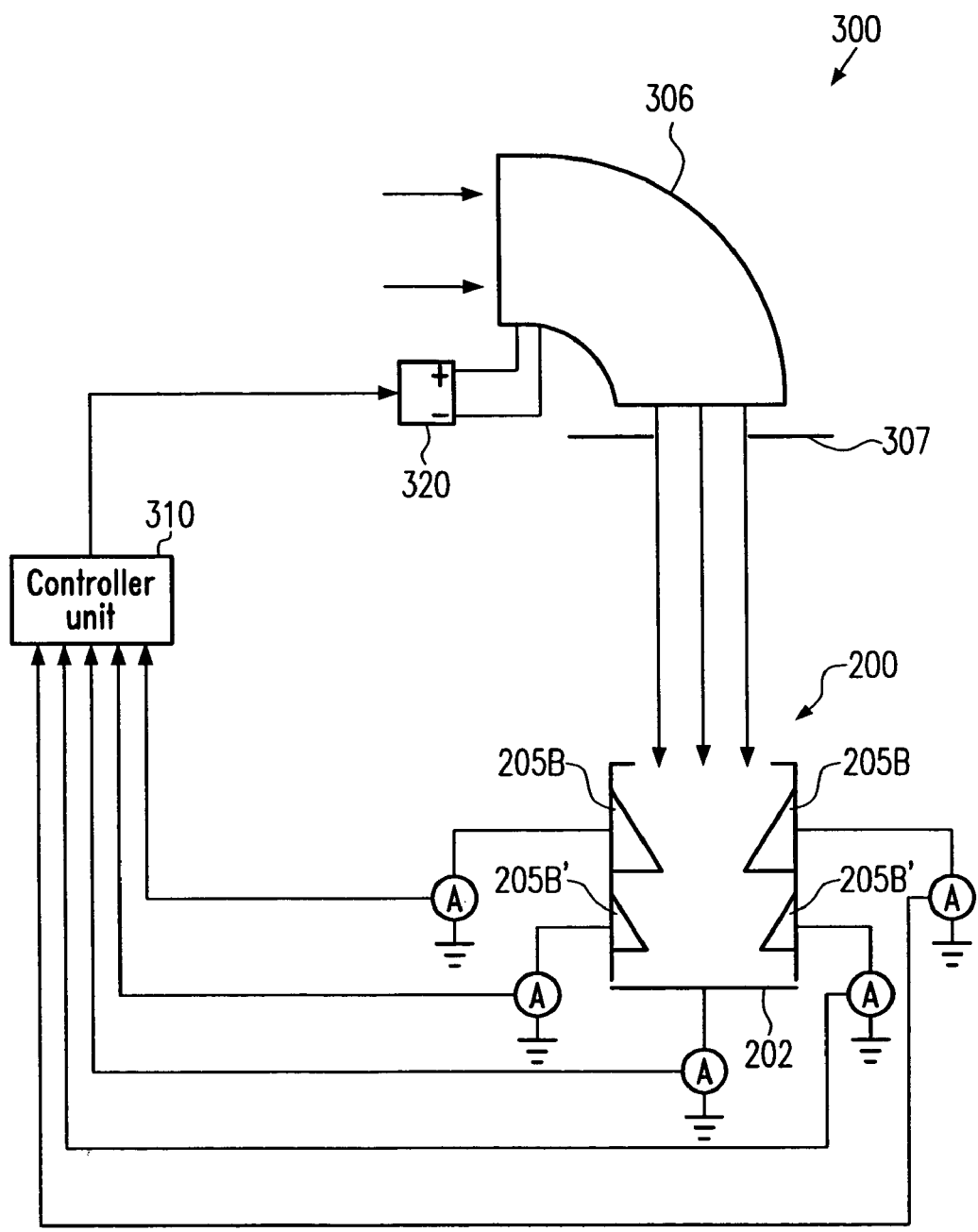
FIG. 3 schematically depicts a system for controlling an ion beam according to the present invention.

FIG. 3 schematically shows a system 300 for using the ion beam detector 200 for adjusting the characteristics of an ion beam of an implantation tool, which, for convenience, is only represented by a deflector magnet 306 driven by a power source 320, wherein an analyzing aperture 307 is disposed downstream of the deflector magnet 306. Moreover, a control unit 310 is connected to the various conductive regions of the ion beam detector 200, which are indicated as 205B, 205B', 205A, 205A' and 202. The control unit 310 is further connected to the power source 320 so as to instruct the power source 320 to supply a corresponding DC current to the deflector magnet 306. In other embodiments, the control unit 310 may be connected to other components of the implantation tool that are relevant for adjusting the beam characteristics. For instance, the control unit 310 may be connected to a power source (not shown) for quadrupole lenses (not shown) required for adjusting the shape of the ion beam.

During operation of the system 300, the control unit 310 receives the measurement readings of the various conductive regions and determines a difference to a desired target value, and this difference may, in turn, be used to re-adjust the current to the deflector magnet 306. For instance, the measurement readings of the conductive regions 205B and 205B' may be less than that of the conductive regions 205A, 205A', thereby indicating a corresponding deviation of the angle of incidence. Moreover, based on the difference between the conductive regions 205A and 205A', the magnitude of the angle of incidence may be estimated so that the direction and the magnitude for the change of current to the deflector magnet 306 may be determined. In other embodiments, the total beam current detected by all of the conductive regions may be estimated and may be used as a weighting factor so as to obtain reliable angle measurements irrespective of any beam current fluctuations. Moreover, the integrated total beam current may also be used as a measure of the uniformity of the beam current over time. Thus, the inventive design of the ion beam detector 200 enables an accurate measurement and hence, control of the ion beam parallelism, wherein substantially no additional requirements are necessary except for the control unit 310. Thus, in existing implantation tools, the conventional Faraday cup may be replaced by the ion detector 200 with only minor modifications on the hardware side.

In other embodiments, the control unit 310 may also control any bias voltages which are applied so as to restrict electron transfer from one conductive region to another one and/or to substantially avoid the escape of electrons from the interior of the ion beam detector 200. Thus, the respective bias voltages may appropriately be adapted to the currently prevailing implantation tool settings, such as ion energy, type of ion species, beam diameter, and the like. For example, if heavy ions are used at moderately high energies, the corresponding bias voltages may be increased so as to reliably minimize the recapture of electrons liberated at adjacent conductive regions. Appropriately selecting the bias voltages may be performed such that during an initial phase, the respective bias voltages are adjusted so that the current reading of each of the conductive regions is at a maximum, thereby indicating that electrons liberated from a certain conductive region are substantially completely recaptured by that region.

Figure 4A:
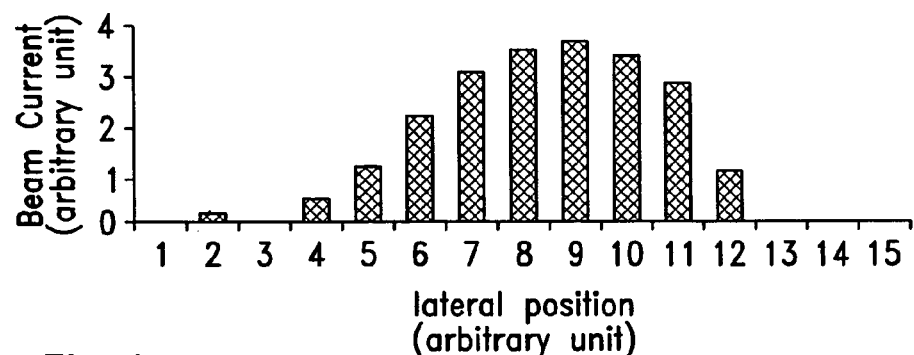
FIGS. 4a–4b representatively illustrate the display of an ion beam profile in accordance with illustrative embodiments of the present invention.
Figure 4B:
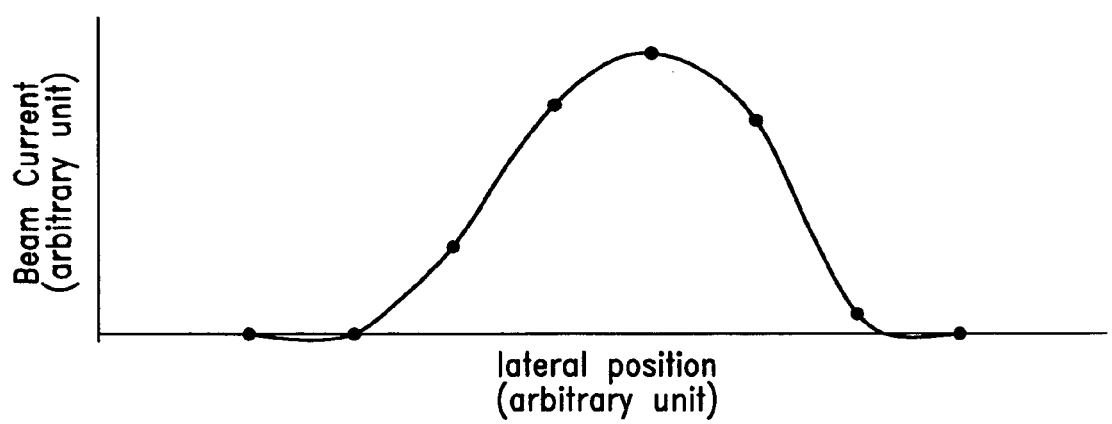

With reference to FIGS. 4a–4b, further improved techniques for controlling an ion beam in an implantation tool, according to the present invention, will now be described. As previously pointed out with reference to FIG. 1, a plurality of Faraday cups (i.e., Faraday cups 111) including a movable shade, may be used to obtain information on the beam profile within a specified area. Conventional systems, however, suffer from a lack of information on the beam current distribution across a lateral distance at any point of time. According to the present invention, the beam current information of a plurality of Faraday cups is displayed simultaneously, or at least within a certain small time interval so that the presentation of the beam current information is quasi-simultaneous, thereby enabling more efficient monitoring and controlling of the ion beam.

According to one illustrative embodiment, a plurality of Faraday cups, such as the cups 111, are provided and arranged across the area which an ion beam is scanned across when processing a substrate, wherein the measurement readings of each cup are displayed to an operator substantially simultaneously.

FIG. 4a schematically depicts a representative example of measurement readings of a plurality of Faraday cups which may be arranged in a single row. As is evident from FIG. 4a, the operator may monitor the current distribution across a specified distance, wherein the display of the measurement readings may be refreshed within sufficiently short time intervals so as to provide a substantially continuous monitoring of the current profile. In this way, the operator may observe any changes in the current distribution when certain parameter values concerning the beam optics and/or the ion source are modified.

In FIG. 4a, the illustration represents a substantially two-dimensional picture of the current distribution, which may be appropriate for beam geometries having a cross-sectional shape, which is significantly greater in one lateral dimension than in the other lateral dimension. In other cases, it may be advantageous and desirable to cover the two-dimensional cross-sectional area of the ion beam or to cover substantially the entire area occupied by a substrate during exposure so as to determine the beam current uniformity at each location of the substrate for substantially equal exposure times at each scan position. The correspondingly obtained uniformity information may then be used in calibrating the scan mechanism of the implantation tool. By simultaneously or quasi-simultaneously displaying the beam current of each Faraday cup in a substantially real-time manner, a three-dimensional picture of the beam current may be continuously monitored.

To this end, the location on a display screen may represent the corresponding location of a Faraday cup, whereas, for example, the color at a specified screen location may represent the magnitude of the beam current. In this way, an operator may conveniently adjust tool parameters while monitoring the actually obtained beam shape and current. The number of Faraday cups used in continuously detecting the beam current may be obtained by experiment, in which a minimum number of measurement readings is determined that is required for reliably adjusting the beam characteristics. In other embodiments, tool dependent requirements may limit the number of Faraday cups that may be used for beam current measurements. For instance, ten or more Faraday cups may be arranged to cover the area of a 200 mm substrate. In other embodiments, twenty or more Faraday cups may be used. In this case, an appropriate data manipulation may be performed so as to interpolate intermediate beam current values.

FIG. 4b gives a representative illustration of a beam current measurement employing only eight Faraday cups, wherein intermediate values are obtained by calculation. As it may readily be appreciated, any type of data manipulation such as interpolation, fitting, and the like, may be used so as to obtain a meaningful representation of the beam current profile. The same holds true for a three-dimensional presentation of the beam current profile.

In one particular embodiment, after having optimized the beam characteristics, the relevant tool settings may be stored as a process recipe so that the corresponding setting may be retrieved once substrates have to be exposed with an energy and an ion species corresponding to the stored process recipe.

In still a further embodiment, the beam current readings of the plurality of Faraday cups are provided to a control unit that is configured to adjust one or more tool parameter values on the basis of the individual beam current readings that are substantially continuously provided to the control unit. For instance, the control unit may be configured in a similar manner as is shown in FIG. 3, wherein the various current readings are provided by different Faraday cups instead of the conductive regions of the ion beam detector 200. For instance, an operator may provide initial maximum margins for one or more tool parameters and the control unit may then, in an actual set-up process, vary the one or more parameter values on the basis of the continuously fed beam current readings so as to obtain a desired distribution of the beam currents, and hence beam characteristics, with respect to the plurality of Faraday cups. Thus, the operator may "teach" the control unit which "knobs" are to be turned within which margins so as to arrive at an optimum solution. The corresponding parameter setting may then be stored as a corresponding process recipe.

Thus, a set-up of a new process recipe may be as follows: First, the ion beam is optimized with respect to energy, beam divergence, ion species, and the like. Second, the shape of the beam is tuned by means of the plurality of Faraday cups in a manner as described above, i.e., by operator, by software, or by both. Third, uniformity across the required substrate surface is established, wherein, as previously described, the measurement readings of the plurality of Faraday cups continuously provided may also efficiently be used. Fourth, the final parameter setting is stored as the new process recipe. After the new process recipe has been learned, the beam set-up merely requires a "set-up recipe" command, wherein a relatively fast fine-tuning may follow so as to compensate for subtle tool variations.

In still other embodiments of the present invention, one or more of the plurality of Faraday cups may be provided in the form as described above with reference to FIGS. 2a–2f, wherein some or all measurement values of the conductive regions may be substantially simultaneously and continuously displayed or supplied to a control unit. For instance, the illustration of the various conductive regions of a Faraday cup, such as the ion detector 200, may provide a visual impression to a machine operator of the angle deviation of an incident ion beam. Thus, the results of a corresponding parameter adjustment may then be directly observed by the operator, thereby significantly facilitating beam optimization. For instance, a convenient visual illustration would be a line or an arrow or any other longitudinal object, the angle of inclination of which would be determined by the corresponding measurement readings of the conductive regions of the ion detector 200. This illustration may then additionally be provided on a screen, wherein the two- or three-dimensional picture of the ion beam is still maintained. For instance, the beam current may be represented by the sum of all measurement readings of the ion beam detector 200 and the location of the ion beam detector 200 within the area of the plurality of Faraday cups may be represented by the corresponding location on the screen. Similarly, the corresponding information may also be provided to an accordingly configured control unit so as to simultaneously process information regarding beam divergence and beam parallelism.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An ion beam detector, comprising:
   a Faraday cup body having a bottom portion, sidewalls and an entrance aperture apposite to said bottom portion;
   a first conductive region formed on said Faraday cup body and having a first detection surface oriented along a first direction; and
   a second conductive region formed on said Faraday cup body, electrically insulated from said first conductive region and having a second detection surface oriented along a second direction that is different from said first direction wherein said first and second conductive regions are timed on said sidewalls in a substantially opposing relationship.

2. The ion beam detector of claim 1, further comprising a third conductive region having a third detection surface oriented along a third direction that differs from at least one of said first and the second directions.

3. The ion beam detector of claim 2, wherein two of said first, second and third conductive regions are formed on said sidewalls in substantially opposing relationship and the other conductive region is formed on said bottom portion.

4. The ion beam detector of claim 3, wherein a further pair of oppositely arranged conductive regions is formed on said sidewalls, each of said conductive regions of said further pair of conductive regions having a detection surface and being electrically insulated from said first, second and third conductive regions.

5. The ion beam detector of claim 4, wherein each of said further pair of conductive regions is aligned with one of said two conductive regions formed on said sidewalls with respect to a longitudinal axis of said Faraday cup body.

6. The ion beam detector of claim 2, wherein said third detection surface is arranged to be substantially shaded by one of said first and second conductive regions when an ion beam enters said entrance aperture substantially parallel with respect to longitudinal axis.

7. The ion beam detector of claim 1, wherein at least one of said first and second conductive regions forms an angled conductive region comprising a surface attached to a sidewall, and a surface that is substantially perpendicular to a longitudinal axis of said Faraday cup body, wherein said detection surface is positioned at an angle relative to said longitudinal axis.

8. The ion beam detector of claim 7, wherein two or more angled conductive regions are provided.

9. The ion beam detector of claim 8, wherein at least two angled conductive regions differ in at least one of said angle and a length of said surface being substantially perpendicular to the longitudinal axis.

10. A method of controlling characteristics of an ion beam, the method comprising:
    obtaining subsequent sets of measurement readings from a plurality of Faraday cups, each Faraday cup being arranged relative to said ion beam so as to receive a portion of said ion beam, each set of measurement readings gathered within a specified time interval, wherein each of said Faraday cups comprises:
    a cup body having a bottom portion, sidewalls and an entrance aperture opposite to said bottom portion:
    a first conductive region formed on said cup body and having a first detection surface oriented along a first direction; and
    a second conductive region formed on said cup body, electrically insulated from said first conductive region and having a second detection surface oriented along a second direction that is different from said first direction wherein said first and second conductive regions are formed on said sidewalls in a substantially opposing relationship; and
    adjusting at least one tool parameter related to said beam characteristics on the basis of said subsequent sets of measurement readings.

11. The method of claim 10, wherein adjusting said at least one tool parameter includes displaying to an operator at least some measurement readings of each set and selecting an appropriate value for said at least one tool parameter by said operator.

12. The method of claim 10, wherein said specified time interval is selected so as to provide a substantially immediate visual response to the operator upon selecting said appropriate parameter value.

13. The method of claim 10, wherein said measurement readings represent a beam current of a respective ion beam portion.

14. The method of claim 13, wherein a number of said Faraday cups is selected to provide information on substantially the entire lateral ion beam extension.

15. The method of claim 14, wherein at least ten Faraday cups are provided when processing a substrate having a diameter of approximately 200 mm and more.

16. The method of claim 10, further comprising determining a difference between each set of measurement readings and a target value and adjusting said at least one tool parameter by maintaining said differences within a predefined tolerance.

17. The method of claim 10, further comprising interpolating between measurement readings of adjacent Faraday cups so as to obtain a substantially continuous beam profile.

18. The method of claim 10, further comprising adjusting an energy and dopant type of said ion beam prior to obtaining said subsequent sets of measurement readings.

19. The method of claim 18, further comprising adjusting an ion beam uniformity for a desired substrate area after adjusting said at least one tool parameter to generate said ion beam substantially exhibiting said characteristics.

20. The method of claim 19, further comprising storing tool parameter values required for obtaining said characteristics as a process recipe.

21. The method of claim 10, further comprising providing at least one Faraday cup having at least two insulated sensitive surface regions that are differently oriented so that said at least one Faraday cup is sensitive to an angle of incidence.

22. The method of claim 21, further comprising monitoring at least one of beam parallelism and beam divergence by analyzing measurement readings of said at least two sensitive surface regions.

23. A Faraday cup, comprising
a bottom portion, sidewalls and an entrance aperture opposite to said bottom portion;
a first conductive region having a first detection surface oriented along a first direction; and
a second conductive region, electrically insulated from said first conductive region, and having a second detection surface oriented along a second direction that is different from said first direction wherein said first and second conductive regions are formed on said sidewalls in a substantially opposing relationship.

24. The Faraday cup of claim 23, further comprising a third conductive region having a third detection surface oriented along a third direction that differs from at least one of said first and the second directions.

25. The Faraday cup of claim 24, wherein two of said first, second and third conductive regions are formed on said sidewalls in substantially opposing relationship and the other conductive region is formed on said bottom portion.

26. The Faraday cup of claim 25, wherein a further pair of oppositely arranged conductive regions is formed on said sidewalls, each of said conductive regions of said further pair of conductive regions having a detection surface and being electrically insulated from said first, second and third conductive regions.

27. The Faraday cup of claim 26, wherein each of said further pair of conductive regions is aligned with one of said two conductive regions formed on said sidewalls with respect to a longitudinal axis of said Faraday cup body.

28. The Faraday cup of claim 24, wherein said third detection surface is arranged to be substantially shaded by one of said first and second conductive regions when an ion beam enters said entrance aperture substantially parallel with respect to longitudinal axis.

29. The Faraday cup of claim 23, wherein at least one of said first and second conductive regions farms an angled conductive region comprising a surface attached to a sidewall and a surface that is substantially perpendicular to a longitudinal axis of said Faraday cup body, wherein said detection surface is positioned at an angle relative to said longitudinal axis.

30. The Faraday cup of claim 29, wherein said angle is selected so as to provide a maximum effective area to the incident ion beam when said incident ion beam has an angle of incidence in the range of approximately 1–5 degrees with respect to the longitudinal axis.

31. The Faraday cup of claim 30, wherein two or more angled conductive regions are provided.

32. The Faraday cup of claim 31, wherein at least two angled conductive regions differ in at least one of said angle and a length of said surface being substantially perpendicular to the longitudinal axis.

* * * * *

UNITED STATES PATENT AND TRADEMARK OFFICE
CERTIFICATE OF CORRECTION

PATENT NO. : 7,026,628 B2
APPLICATION NO. : 10/786456
DATED : April 11, 2006
INVENTOR(S) : Christian Krueger It is certified that error appears in the above-identified patent and that said Letters Patent is hereby corrected as shown below:

Col. 13, line 29 (claim 1, line 3), change "apposite" to -- opposite --.

Col. 13, line 39 (claim 1, line 13), change "timed" to -- formed --.

Col. 16, line 15 (claim 19, line 2), change "farms" to -- forms --.

Signed and Sealed this

Twenty-fifth Day of July, 2006

JON W. DUDAS
*Director of the United States Patent and Trademark Office*